United States Patent
Takenaka

(10) Patent No.: US 8,472,009 B2
(45) Date of Patent: Jun. 25, 2013

(54) EXPOSURE APPARATUS AND DEVICE MANUFACTURING METHOD

(75) Inventor: Tsutomu Takenaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 295 days.

(21) Appl. No.: 12/872,972

(22) Filed: Aug. 31, 2010

(65) Prior Publication Data

US 2011/0058151 A1    Mar. 10, 2011

(30) Foreign Application Priority Data

Sep. 8, 2009    (JP) .................................. 2009-207533

(51) Int. Cl.
| | |
|---|---|
| *G01B 11/00* | (2006.01) |
| *G03B 27/32* | (2006.01) |
| *G03B 27/42* | (2006.01) |
| *G03B 27/54* | (2006.01) |
| *G03B 27/62* | (2006.01) |
| *G03B 27/72* | (2006.01) |

(52) U.S. Cl.
USPC ................... 355/72; 355/53; 355/67; 355/75; 355/77; 356/399

(58) Field of Classification Search
USPC .... 257/797; 310/12.05–12.06, 12.19; 355/53, 355/55, 67–68, 72, 75, 77; 356/399–401, 356/614–616, 620, 622, 624; 382/151
See application file for complete search history.

(56) References Cited

U.S. PATENT DOCUMENTS

| 7,193,685 B2 | 3/2007 | Miura |
| 2008/0049203 A1 | 2/2008 | Mishima |

FOREIGN PATENT DOCUMENTS

| JP | 2005-175400 A | 6/2005 |
| JP | 2008-053618 A | 3/2008 |

*Primary Examiner* — Hung Henry Nguyen
*Assistant Examiner* — Colin Kreutzer
(74) *Attorney, Agent, or Firm* — Canon U.S.A., Inc. IP Division

(57) ABSTRACT

An exposure apparatus which projects a pattern of an original onto a substrate by a projection optical system, comprises a measurement device configured to measure a relative position between an original stage and a substrate stage via the projection optical system using an original-side fiducial plate and a substrate-side fiducial plate, and a controller, the original-side fiducial plate including first and second original-side marks, and the substrate-side fiducial plate including first and second substrate-side marks, wherein the controller is configured to control imaging characteristics of the projection optical system so that measurement of the relative position between the original stage and the substrate stage using the first original-side mark and the first substrate-side mark and measurement of the relative position between the original stage and the substrate stage using the second original-side mark and the second substrate-side mark can be performed simultaneously.

13 Claims, 7 Drawing Sheets

EXPOSURE APPARATUS AND DEVICE MANUFACTURING METHOD

BACKGROUND OF THE INVENTION

1. Field of the Invention

The present invention relates to an exposure apparatus and a method of manufacturing a device using the same.

2. Description of the Related Art

An exposure apparatus uses TTR (Through The Reticle) measurement as a method of relative alignment between a reticle (original) and a wafer (substrate). In the TTR measurement, the relative position between a reticle-side measurement mark formed on a reticle or a fiducial plate placed in its vicinity, and a wafer-side measurement mark formed on a wafer or a fiducial plate placed in its vicinity is measured via a projection optical system. It is a common practice in the TTR measurement to use, as measurement light, light containing the same wavelengths as exposure light.

The TTR measurement can also be used to measure various kinds of parameters by measuring a plurality of points within a region to which a pattern is projected by a projection optical system. Rotational components and a magnification, for example, can be measured by measuring the relative position between two points within a plane perpendicular to the optical axis of a projection optical system. Distortion can also be measured by increasing the number of measurement points. Similarly, the tilt and curvature of field of the image plane of a projection optical system can be measured by measuring the positions of measurement points in the optical axis direction (see Japanese Patent Laid-Open No. 2005-175400).

The resolution limit (critical dimension (CD) or minimum feature size) of an exposure apparatus is proportional to the wavelength of exposure light, and is inversely proportional to the numerical aperture of a projection optical system. Hence, an exposure apparatus has been developed by shortening the exposure wavelength, and increasing the NA of a projection optical system in order to improve the resolution limit. However, the depth of focus of a projection optical system is proportional to the wavelength of exposure light, and is inversely proportional to the square of the numerical aperture of the projection optical system. Therefore, the depth of focus is rapidly decreasing with an increase in resolution of an exposure apparatus, and a demand for higher accuracy of focusing performed based on TTR measurement is becoming stricter.

Also, since the device line width narrows with an improvement in resolution limit, a demand for higher accuracy of alignment performed within a plane perpendicular to the optical axis based on TTR measurement is becoming stricter as well.

To meet these demands, an image obtained by projecting a mark for use in TTR measurement onto the image plane of a projection optical system is desirably similar to an image of a device. Hence, the line width of a mark for use in TTR measurement is narrowing as well.

On the other hand, an exposure apparatus must have a high throughput in order to produce devices in large quantities in a short period of time. This makes it necessary to shorten the time taken for TTR measurement. In TTR measurement of a plurality of points, the measurement time can be shortened by simultaneously measuring two or more measurement points. Simultaneous measurement of a plurality of points can be done by setting a plurality of pairs of a reticle-side measurement mark and a wafer-side measurement mark (see Japanese Patent Laid-Open No. 2008-53618).

Unfortunately, simultaneous measurement of a plurality of pairs of marks is becoming difficult owing to, for example, a reduction in detection range, which accompanies miniaturization of marks for use in TTR measurement; manufacturing errors of the marks; and a shift in imaging position due to a change in imaging performance of a projection optical system, which accompanies exposure. It is becoming difficult to, for example, perform TTR measurement of one pair of a reticle-side measurement mark and a wafer-side measurement mark, while performing TTR measurement of another pair of a reticle-side measurement mark and a wafer-side measurement mark.

SUMMARY OF THE INVENTION

The present invention provides a technique advantageous to speed up TTR measurement.

One of the aspects of the present invention provides an exposure apparatus which projects a pattern of an original onto a substrate by a projection optical system to expose the substrate, the apparatus comprising a measurement device configured to measure a relative position between an original stage and a substrate stage via the projection optical system using an original-side fiducial plate arranged on one of the original and the original stage, and a substrate-side fiducial plate arranged on the substrate stage, and a controller configured to control the projection optical system, the original-side fiducial plate including a first original-side mark and a second original-side mark, and the substrate-side fiducial plate including a first substrate-side mark and a second substrate-side mark, wherein the controller is configured to control imaging characteristics of the projection optical system so that measurement of the relative position between the original stage and the substrate stage using the first original-side mark and the first substrate-side mark and measurement of the relative position between the original stage and the substrate stage using the second original-side mark and the second substrate-side mark can be performed simultaneously.

Further features of the present invention will become apparent from the following description of exemplary embodiments with reference to the attached drawings.

DESCRIPTION OF THE EMBODIMENTS

Figure 1:
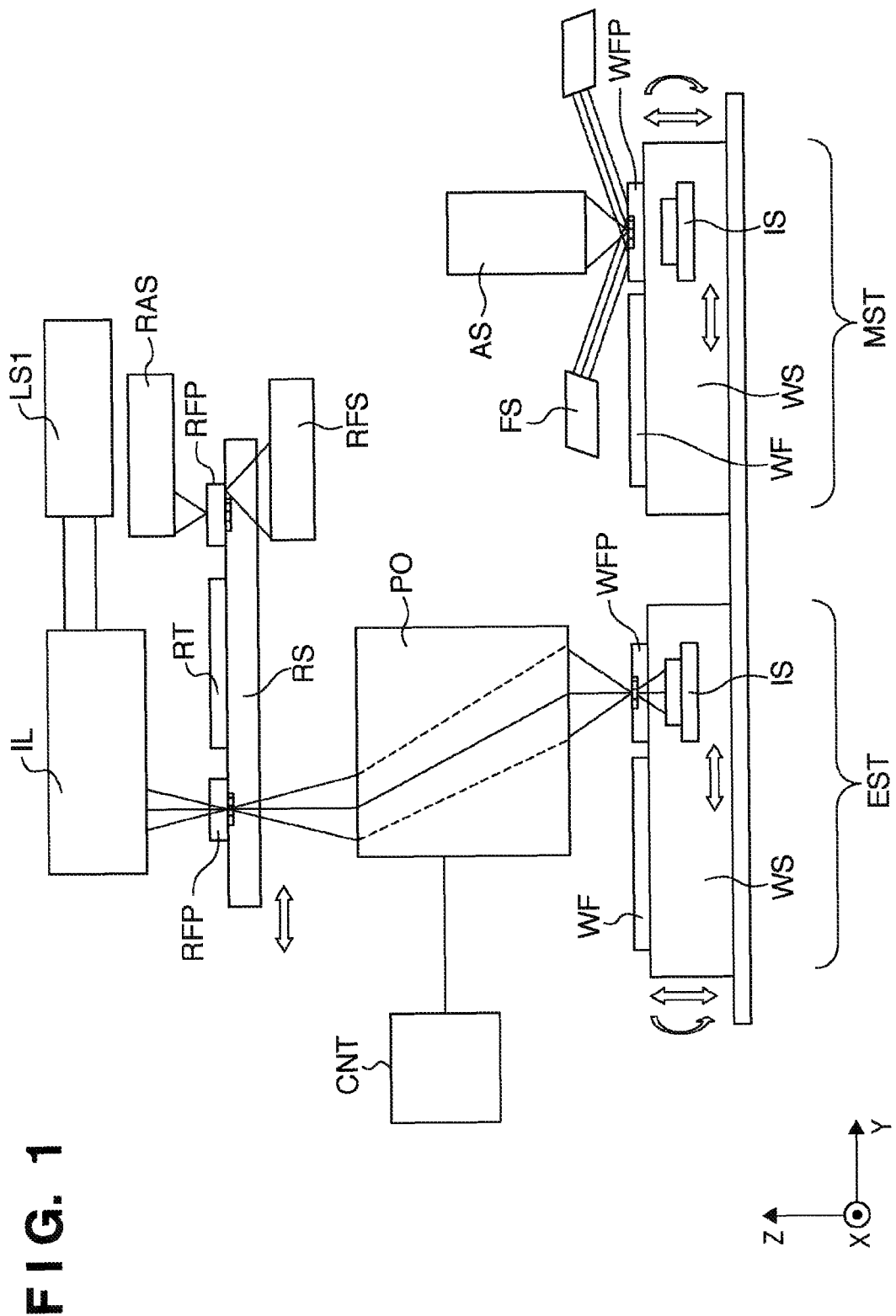
FIG. 1 is a view schematically showing the arrangement of an exposure apparatus according to one embodiment of the present invention.

Embodiments of the present invention will be described below with reference to the accompanying drawings. Note that the same reference numerals denote the same elements throughout the specification and the accompanying drawings. Also, in the specification and the accompanying drawings, a direction parallel to the optical axis of a projection optical system is defined as the Z direction, and two orthogonal directions within a plane perpendicular to the Z direction are defined as the X direction (first direction) and the Y direction (second direction), respectively. The Z direction will also be referred to as the focus direction.

First Embodiment

FIG. 1 is a view schematically showing the arrangement of an exposure apparatus according to one embodiment of the present invention. Light emitted by a light source LS1 enters an illumination optical system IL, and forms an exposure region with a band shape elongated in the X direction or an arcuated shape on a reticle (original) RT. The reticle RT and a wafer (substrate) WF are placed at optically nearly conjugate positions (the object plane and image plane of a projection optical system PO) via the projection optical system PO. The reticle RT is held by a reticle stage (original stage) RS, and the wafer WF is held by a wafer stage (substrate stage) WS. The pattern of the reticle RT is projected onto the wafer WF by moving both the reticle stage RS and the wafer stage WS relative to the optical axis of the projection optical system PO at a speed ratio corresponding to the optical magnification of the projection optical system PO. The wafer WF is exposed by pattern projection onto it, so a photosensitive agent applied on the wafer WF is exposed to light.

The reticle stage RS which holds the reticle RT is driven in the Y direction (the scanning direction in scanning exposure) by a position control mechanism including a laser interferometer and driving mechanism. Reticle-side fiducial plates (original-side fiducial plates) RFP are arranged within predetermined ranges on the reticle stage RS near the reticle RT. The pattern surfaces of the reticle-side fiducial plates RFP are nearly flush with the reflecting surface of the reticle RT.

Figure 2A:
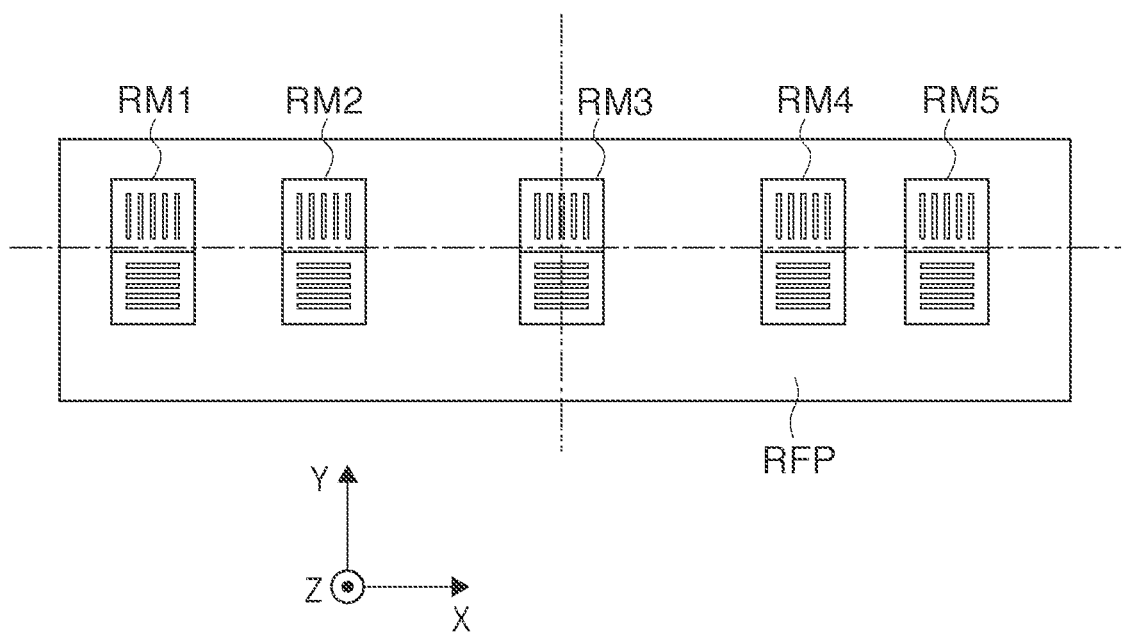
FIGS. 2A and 2B are views showing an example of the arrangement of reticle-side measurement marks.

Reticle-side measurement marks made of a metal such as Cr, Al, or Ta are arranged on the reflecting surface of the reticle-side fiducial plate RFP. More specifically, as illustrated in FIG. 2A, a plurality of reticle-side measurement marks (original-side marks) RM are formed on the reticle-side fiducial plate RFP as the reticle-side measurement marks with the above-mentioned arrangement so that measurement can be performed at a plurality of image heights in the X direction within the exposure region. Although FIGS. 2A and 2B illustrate five marks RM1 to RM5 formed as the plurality of reticle-side measurement marks RM, the present invention is not limited to this, and at least two marks (a first original-side mark and a second original-side mark) need only be formed.

Figure 2B:
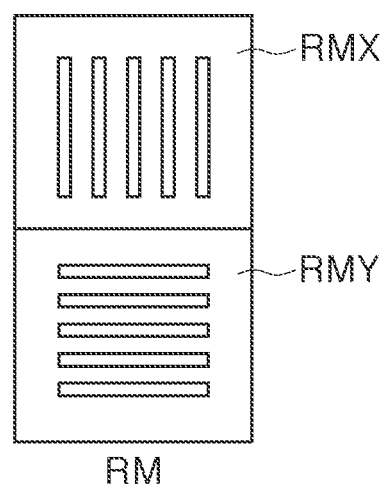

The reticle-side measurement mark RM is illustrated in FIG. 2B, and has, for example, a line-and-space pattern including a light-shielding portion and rectangular openings with a width close to an exposure resolution line width corresponding to the scale on the reticle RT. For the sake of convenience, a mark having lines in a direction perpendicular to the X direction (a mark for measuring the position in the X direction) is defined as RMX, and a mark having lines in a direction perpendicular to the Y direction (a mark for measuring the position in the Y direction) is defined as RMY. However, the marks RMX and RMY are not limited to those as illustrated in FIG. 2B, and may have, for example, line-and-space patterns which make predetermined angles with the X direction. The marks RMX and RMY may also be, for example, marks each having a single line or marks having square patterns instead of line patterns. Also, although the reticle-side measurement mark RM includes two types of marks RMX and RMY in FIG. 2B, it may include one or three or more types of marks.

FIG. 1 shows an example in which two reticle-side fiducial plates RFP align themselves across the reticle RT in the Y direction serving as the scanning direction. However, one or three or more reticle-side fiducial plates RFP may be used. Also, the reticle-side fiducial plate RFP may include a pattern other than the marks RM. In another embodiment, the marks RM may be formed on the reticle RT. In this case, the marks RM are arranged so as not to influence a device pattern to be transferred by exposure.

The exposure apparatus includes a reticle alignment sensor RAS and reticle focus sensor RFS as relative position measurement devices that measure the relative position between the reticle-side fiducial plate RFP and the reticle RT. The reticle alignment sensor RAS can include, for example, a two-dimensional image sensing element and optical element. The relative position between the reticle-side fiducial plate RFP and the reticle RT in the X and Y directions can be measured by moving the reticle alignment sensor RAS or the reticle stage RS. Although FIG. 1 illustrates only one reticle alignment sensor RAS, two or more reticle alignment sensors RAS may be provided. A magnification in the X direction and rotation about the Z-axis, for example, can be measured by juxtaposing two reticle alignment sensors RAS with a spacing between them in the X direction.

An oblique incidence sensor, for example, can also be used as the reticle focus sensor RFS. The relative position between the reticle-side fiducial plate RFP and the reticle RT in the Z direction can be measured by moving the reticle focus sensor RFS or the reticle stage RS. Although FIG. 1 illustrates only one reticle focus sensor RFS, two or more reticle focus sensors RFS may be provided. The relative position between the reticle-side fiducial plate RFP and the reticle RT in the Z direction can be measured as a three-dimensional pattern on the X-Y plane by juxtaposing a plurality of reticle focus sensors RFS in the X direction, and moving the reticle stage RS in the Y direction.

Figure 3A:
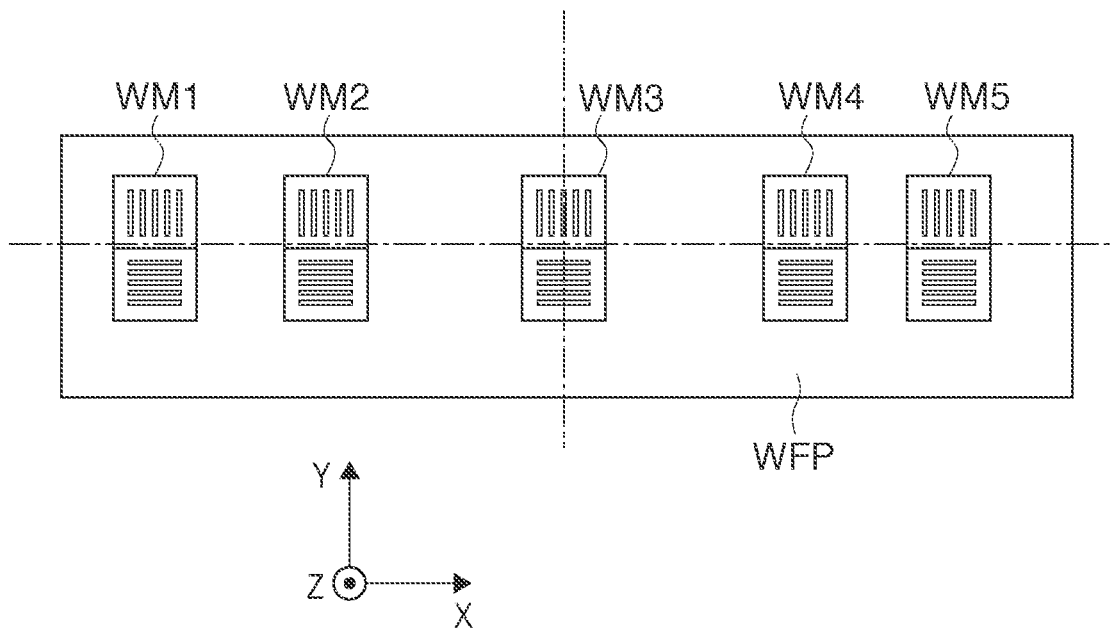
FIGS. 3A and 3B are views showing an example of the arrangement of wafer-side measurement marks.

On the other hand, a wafer-side fiducial plate (substrate-side fiducial plate) WFP on which wafer-side marks are formed is arranged within a predetermined range on the wafer stage WS near the wafer WF. The surface of the wafer-side fiducial plate WFP is flush with the upper surface of the wafer WF. Wafer-side position measurement marks WM made of a metal such as Cr, Al, or Ta are arranged on the surface of the wafer-side fiducial plate WFP. More specifically, as illustrated in FIG. 3A, a plurality of wafer-side measurement marks (substrate-side marks) WM are formed on the wafer-side fiducial plate WFP as the wafer-side measurement marks with the above-mentioned arrangement so that measurement can be performed at a plurality of image heights in the X direction within the exposure region. Although FIG. 3A illustrates five marks WM1 to WM5 formed as the plurality of wafer-side marks WM, the present invention is not limited to this, and at least two marks (a first substrate-side mark and a second substrate-side mark) need only be formed.

Figure 3B:
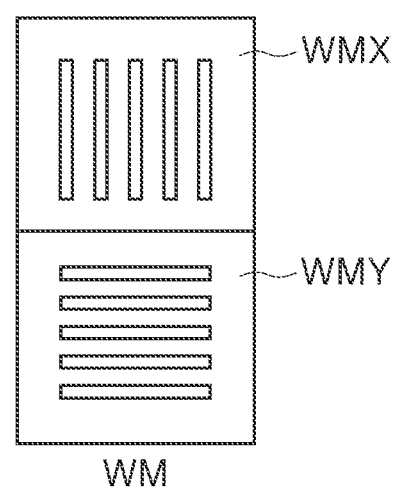

The wafer-side measurement mark WM is illustrated in FIG. 3B, and has, for example, a line-and-space pattern including a light-shielding portion and rectangular openings with a width close to an exposure resolution line width. For the sake of convenience, a mark having lines in a direction perpendicular to the X direction (a mark for measuring the position in the X direction) is defined as WMX, and a mark having lines in a direction perpendicular to the Y direction (a mark for measuring the position in the Y direction) is defined as WMY. However, the marks WMX and WMY are not limited to marks as illustrated in FIG. 3B, and may have, for example, line-and-space patterns which make predetermined angles with the X direction. Also, although the mark WM includes two types of marks WMX and WMY in FIG. 3B, it may include one or three or more types of marks.

A photosensor (a measurement device or a TTR measurement device) IS for detecting the amount of light transmitted through the wafer-side position measurement marks WM is placed in the wafer stage WS below the wafer-side position measurement marks WM. Although one wafer stage WS includes only one set of the wafer-side fiducial plate WFP and the photosensor IS in FIG. 1, the present invention is not limited to this, and two or more sets of the wafer-side fiducial plate WFP and the photosensor IS may be provided.

The wafer stage WS is controlled in six axial directions: the optical axis direction (Z direction) of the projection optical system PO, two directions within a plane (X-Y plane) perpendicular to the optical axis direction, a rotation direction about the optical axis (θ direction), and tilt directions with respect to the image plane. A moving mirror which reflects a beam from a laser interferometer (position measurement device) is fixed on the wafer stage WS, and used to measure the position of the wafer stage WS by the laser interferometer.

The exposure apparatus according to one embodiment of the present invention, illustrated in FIG. 1, is designed as a twin-stage exposure apparatus, which includes two wafer stages WS. While one wafer stage WS is positioned in an exposure station EST for exposure, the other wafer stage WS is positioned in a measurement station MST for alignment measurement. Note that the alignment measurement in the measurement station MST includes measurement for obtaining information used to align each shot region on the wafer WF with the reticle RT.

A focus sensor FS and alignment sensor AS are placed in the measurement station MST. The position of the wafer stage WS positioned in the exposure station EST is measured by a laser interferometer for the exposure station EST. The position of the wafer stage WS positioned in the measurement station MST is measured by a laser interferometer for the measurement station MST.

When both exposure of the wafer held by one wafer stage WS, and measurement of the wafer held by the other wafer stage WS are complete, the two wafer stages WS are interchanged with each other, that is, their swap operation is performed. After the swap operation, the wafer stage WS having moved to the exposure station EST performs an exposure operation, and the wafer stage WS having moved to the measurement station MST unloads the exposed substrate and, as needed, loads a new wafer and performs measurement for obtaining information used to align each shot region on the wafer WF with the reticle RT.

Although the exposure apparatus in this embodiment has a twin-stage configuration, the present invention is not limited to this. A single stage or three or more stages may be used.

The exposure station EST and measurement station MST control the wafer stages WS using their independent laser interferometers. Therefore, switching from one laser interferometer to the other takes place before and after swapping the wafer stages WS. During this switching, the measurement value obtained by the laser interferometer for the exposure station EST, and that obtained by the laser interferometer for the measurement station MST are relayed to each other. At this time, the relay must be performed free from any errors of the measurement values obtained by the laser interferometers, but this is very difficult in practice. If errors occur at that time, this generates an error in the position of the wafer stage WS, thus influencing the overlay accuracy that is of prime importance for the exposure apparatus. This error is generated upon swapping the wafer stages WS between the exposure station EST and the measurement station MST, and is therefore commonly called a swap error. To calibrate this swap error, calibration measurement called TTR measurement is performed in the exposure station EST using the photosensor (measurement device) IS.

Figure 4A:
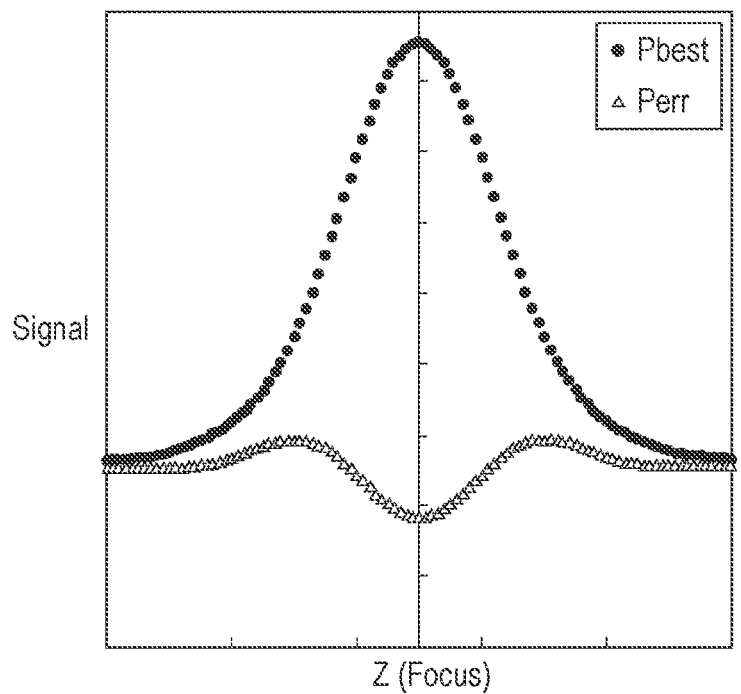
FIGS. 4A and 4B are graphs showing an example of waveforms in TTR measurement.
Figure 4B:
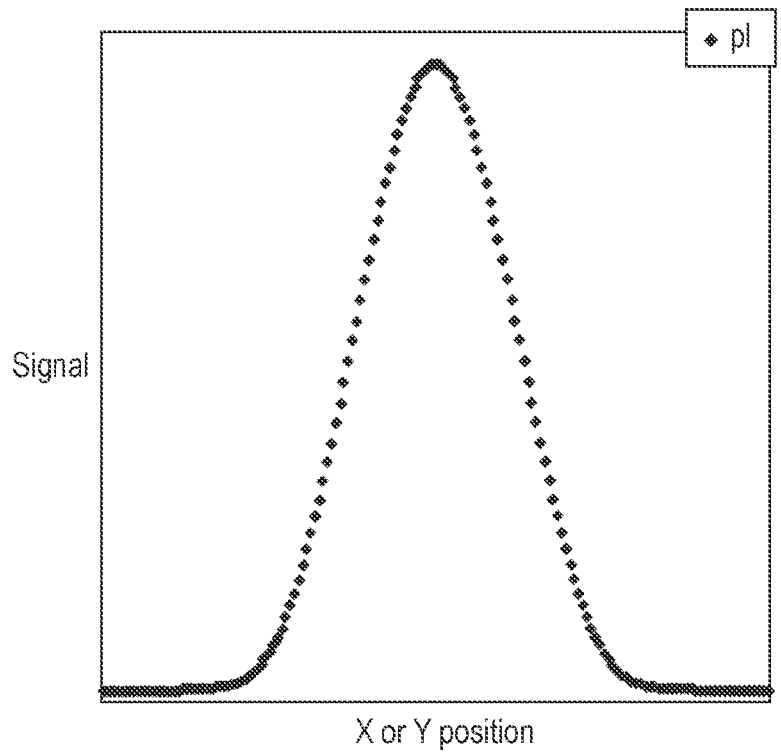

The TTR measurement is used to detect the relative position between the reticle RT or reticle-side fiducial plate RFP and the wafer-side fiducial plate WFP. Light emitted by the light source LS1 is shaped by the illumination optical system IL, and illuminates the reticle-side measurement marks RM on the reticle RT or reticle-side fiducial plate RFP. The light transmitted through the glass portion of the reticle-side measurement mark RM impinges on the wafer-side position measurement mark WM on the wafer-side fiducial plate WFP via the projection optical system PO, and strikes the photosensor IS below the wafer-side position measurement mark WM. The amount of incident light on the photosensor IS can be changed by driving the wafer stage WS in the Z direction or in the two-dimensional directions in the X-Y plane. In, for example, TTR measurement in the Z direction, a signal exemplified by Pbest in FIG. 4A can be obtained by measuring the amount of incident light on the photosensor IS while driving the wafer stage WS in the Z direction. This signal shows a contrast that the reticle-side measurement mark RM projects onto the wafer-side position measurement mark WM via the projection optical system PO, and a Z position which exhibits a maximum contrast corresponds to a focal position. Moreover, the amount of incident light on the photosensor IS can be changed by driving the wafer stage WS in the X direction at a given Z position, set based on the measurement result, in measurement in the X direction, and in the Y direction at the given Z position in measurement in the Y direction. FIG. 4B exemplifies the output from the photosensor IS at this time. An optimum relative position between the reticle-side measurement mark RM and the wafer-side position measurement mark WM in the X or Y direction can be obtained based on this signal. In this manner, the relative position between the reticle-side measurement mark RM and the wafer-side position measurement mark WM can be obtained by measuring a change in amount of incident light on the photosensor IS.

More precise position information can be obtained by arranging a plurality of pairs of a reticle-side measurement mark RM and a wafer-side position measurement mark WM, and performing TTR measurement using them. When, for example, measurement is performed at a plurality of image heights in the Z direction, curvature of field, astigmatism, and the tilt of the image plane, for example, can be obtained. Also, when measurement is performed at a plurality of image heights in the X and Y directions each, a magnification, distortion, and rotation, for example, can be obtained. The use of these measurement results allows optimization of the imaging characteristics of the projection optical system PO, and relative driving of the reticle stage RS and wafer stage WS to optimum positions.

However, in TTR measurement in the Z direction, the positions of the reticle-side measurement mark RM and wafer-side position measurement mark WM in the X and Y directions must coincide with each other with an error that falls within a tolerance in advance. If the positions of these two marks shift from each other with an error that falls outside the tolerance, a signal as exemplified by Perr in FIG. 4A is detected by the photosensor IS, so precise measurement cannot be performed in that case. The tolerance in the X and Y directions becomes stricter as the line widths of the marks RM and WM used for TTR measurement narrow. To align the positions of the marks RM and WM in the X or Y direction with an error that falls within a tolerance, it is a common practice to keep a swap error small or repeat TTR measurement.

As the measurement time must be shortened to keep up with a high productivity, it is effective to simultaneously perform TTR measurement of the plurality of pairs of marks RM and WM. To do this, the relative positions between the plurality of pairs of marks RM and WM must nearly coincide with each other. In other words, the relative position between one pair of marks RM and WM must nearly coincide with that between another pair of marks RM and WM. However, the plurality of reticle-side measurement marks RM have individual manufacturing errors, and are therefore different from design values. The same applies to the wafer-side position measurement marks WM. Also, the imaging characteristics (for example, the magnification and distortion) of the projection optical system PO, for example, change due to, for example, an environmental change and factors associated with the load characteristics during device manufacture. Thus, the distance between the individual marks RM (for example, the distance between the marks RM1 and RM2 in FIG. 2A) has an error with respect to a design value. In addition, the positions of images of the reticle-side measurement marks RM projected onto the wafer-side position measurement marks WM via the projection optical system PO also fluctuate during device manufacture. The same applies to the wafer-side position measurement marks WM, so the distance between the individual marks WM (for example, the distance between the marks WM1 and WM2 in FIG. 3A) has an error with respect to a design value. Hence, it is difficult to perform relative alignment between the plurality of pairs of marks RM and WM in order to simultaneously measure the plurality of pairs of marks RM and WM.

In this embodiment, a controller CNT controls or changes at least one of the imaging characteristics (typically, the magnification and distortion) of the projection optical system PO so that the plurality of pairs of marks RM and WM can be simultaneously measured.

For the sake of descriptive simplicity, a method of simultaneously performing measurement using the mark RM1 illustrated in FIG. 2A paired with the mark WM1 illustrated in FIG. 3A, and measurement using the mark RM5 illustrated in FIG. 2A paired with the mark WM5 illustrated in FIG. 3A (that is, measurement at two image heights) will be described first.

Figure 5:
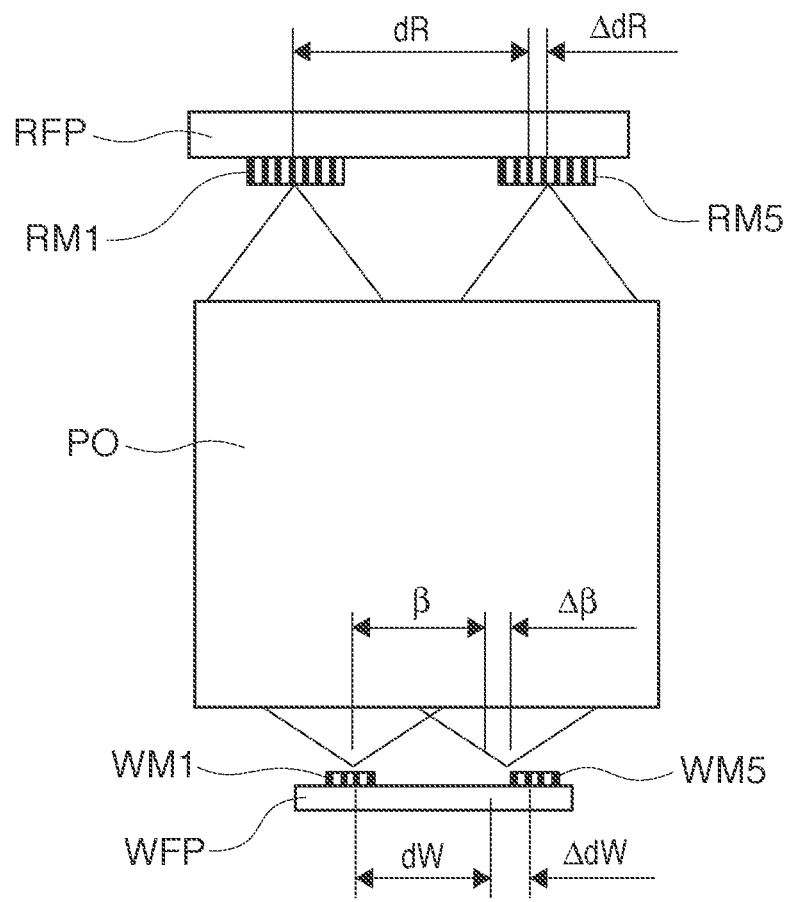
FIG. 5 is a schematic view showing the principle of TTR measurement.

FIG. 5 is a schematic view showing the exposure apparatus at the time of TTR measurement, and does not show any portions unnecessary for description. Let dR be the design distance between the marks RM1 and RM5 formed on the reticle-side fiducial plate RFP, and $\Delta dR$ be the difference between the design value and an actual distance due to, for example, manufacturing errors of the marks RM1 and RM5. Similarly, let dW be the design distance between the marks WM1 and WM5 formed on the wafer-side fiducial plate WFP, and $\Delta dW$ be the difference between the design value and an actual distance due to, for example, manufacturing errors of the marks WM1 and WM5. First, when the marks RM1, RM5, WM1, and WM5 have no design errors, the state in which the relative positions among the marks RM1, RM5, WM1, and WM5 are optimum is described by:

$$dR \cdot \beta_0 = dW \qquad (1)$$

where $\beta_0$ is the projection magnification of the projection optical system PO in a steady state.

The state in which the relative position is optimum means herein that under which TTR measurement using the pair of marks RM1 and WM1, and TTR measuring using the pair of marks RM5 and WM5, can be simultaneously performed.

Next, when the marks RM1, RM5, WM1, and WM5 have the design errors $\Delta dR$ and $\Delta dW$, the state in which the relative positions among the marks RM1, RM5, WM1, and WM5 are optimized by changing the projection magnification of the projection optical system PO to a projection magnification $\beta_1$ is described by:

$$(dR + \Delta dR) \cdot \beta_1 = dW + \Delta dW \qquad (2)$$

Let $\Delta \beta$ be the amount of change in magnification of the projection optical system PO due to an environmental change and a load associated with device manufacture. Then, the state in which the relative positions among the marks RM1, RM5, WM1, and WM5 are optimized by changing the projection magnification of the projection optical system PO to a projection magnification $\beta_2$ is described by:

$$(dR + \Delta dR) \cdot (\beta_2 + \Delta \beta) = dW + \Delta dW \qquad (3)$$

for $$\beta_2 = \beta_1 - \Delta \beta \qquad (4)$$

In accordance with the above-mentioned principle, the controller CNT changes the projection magnification $\beta$ of the projection optical system PO based on a deviation of the actual positions of the marks from the design values due to, for example, their manufacturing errors, a load associated with device manufacture, and an environmental change. This amount of change is determined such that TTR measurement using the pair of marks RM1 and WM1, and TTR measurement using the pair of marks RM5 and WM5, can be simultaneously performed.

In the above-described example, $\Delta dR$ and $\Delta dW$ can be obtained by measurement in advance. A value $\beta_1$ necessary to cancel $\Delta dR$ and $\Delta dW$ can also be obtained in advance. That is, given dR, $\Delta dR$, dW, and $\Delta dW$ in equation (2), $\beta_1$ can be determined based on equation (2). The amount of driving of an optical element for use in magnification adjustment in the projection optical system PO to obtain a desired projection magnification $\beta_1$ can also be obtained in advance. As for $\Delta \beta$, the relationship between the amount $\Delta \beta$ of change in magnification of the projection optical system PO, and a load associated with device manufacture and various types of loads such as an environmental load can be obtained in advance by measurement or simulation. This makes it possible to determine a value $\Delta \beta$ corresponding to the loads based on the obtained relationship. Since the value $\beta_2$ is determined by the values $\beta_1$ and $\Delta \beta$, equation (3) always holds.

Note that $\beta_2$ is the magnification of the projection optical system PO, which is optimum for simultaneous TTR measurement at a plurality of image heights (a plurality of positions) but may not be optimum in exposure of a wafer to manufacture a device (to be simply referred to as in exposure hereinafter). In this case, it is desirable to hold $\beta_2$ separately for an optimum magnification in exposure, set the magnification of the projection optical system PO to $\beta_2$ only in TTR measurement, and return that magnification in exposure. This makes it possible to optimize the magnification of the projection optical system PO both in TTR measurement and exposure. By calculating a correction value which reflects $\beta_2$ on the exposure apparatus from the measurement values obtained by TTR measurement at this time, precise alignment can be performed even if a manufacturing error ($\Delta dR$ or $\Delta dW$) or a change in projection magnification ($\Delta \beta$) occurs.

Another method for determining $\beta_1$ in the exposure apparatus will be described next. If TTR measurement using the marks RM1 and WM1, and TTR measurement using the marks RM5 and WM5, can be simultaneously performed, they are performed simultaneously; otherwise, they are performed sequentially. Based on the TTR measurement results, $\beta_1$ can be obtained. That is, $\beta_1$ can be obtained based on the amount of shift of the measurement value obtained by TTR measurement using the marks RM1 and WM1 from the design value, and that of the measurement value obtained by TTR measurement using the marks RM5 and WM5 from the design value. Upon such measurement, a signal as exemplified by Perr in FIG. 4A may be generated due to a manufacturing error such as ΔdR or ΔdW. In such a case, a signal Pbest can be obtained by trial-and-error measurement such as repetition of Z measurement while minutely changing the mark position in the X or Y direction. Since the minute change in position is less effective if it is larger than the rectangular opening width of the mark WM or RM, the change preferably is about ½ the rectangular opening width. Also, the minute change in position is preferably repeated a number of times which makes the accumulated amount of change in position nearly equal to the sum of the rectangular opening width and the width of the light-shielding portion at a maximum. Repetition in excess of that number of times wastes time because this results in cyclical repetition. This method measures ΔdR and ΔdW at once.

In contrast, to separately measure ΔdR and ΔdW, TTR measurement is performed using the marks RM1 and WM1 first, and using the marks RM1 and WM5 next. This makes it possible to measure the interval between the marks WM1 and WM5, that is, ΔdW with reference to the amount of driving of the wafer stage WS. Likewise, when TTR measurement is performed using the marks RM1 and WM1 first, and using the marks RM5 and WM1 next, it is possible to measure the interval between the marks RM1 and RM5, that is, ΔdR with reference to the amount of driving of the wafer stage WS. However, note that ΔdR contains the projection magnification of the projection optical system PO, so the projection optical system PO is desirably in a steady state or a known state. Although the foregoing description is concerned with a method of determining $\beta_1$, $\beta_2$ can also be determined given Δβ.

Also, if the obtained TTR measurement results show that Δβ has changed, $\beta_2$ is changed in accordance with a change in Δβ in the next TTR measurement, thereby always performing TTR measurement in an optimum state.

The measurement order and combination of the marks RM and WM are not limited to those described earlier.

Although a method of aligning the relative positions among the four marks RM1, RM5, WM1, and WM5 has been described above for the sake of simplicity, the relative positions among more than four marks can also be aligned. In this case, β is represented by a high-order polynomial instead of a first-order coefficient (that is, a magnification) such as a projection magnification. In a general semiconductor exposure apparatus, it is often the case that a magnification is defined by a first-order coefficient, and distortion is defined by a third-order polynomial, so β is also desirably defined by a first-order coefficient or a third-order polynomial.

Second Embodiment

The second embodiment of the present invention will be described below. Details which are not particularly referred to in the second embodiment can be the same as in the first embodiment. Details of the second embodiment will be described with reference to FIG. 6. The design X-coordinates of marks WMX11 and WMX12 serving as marks WMX for measuring the positions in the X direction are spaced apart from each other by a minute distance Δx. A WM mark WMX1n is set at the n-th position assuming that the mark WMX11 is at the first position, and is spaced apart from the mark WMX11 by a distance Δx·(n−1). Marks WMX51, WMX52, ..., WMX5n are set in the same way, and have a Δx direction between them, which is totally opposite to that of the marks WMX11, WMX12, ..., WMX1n. In other words, pluralities of marks WMX1 and WMX5 are arranged with minutely different relative distances between them.

Figure 6:
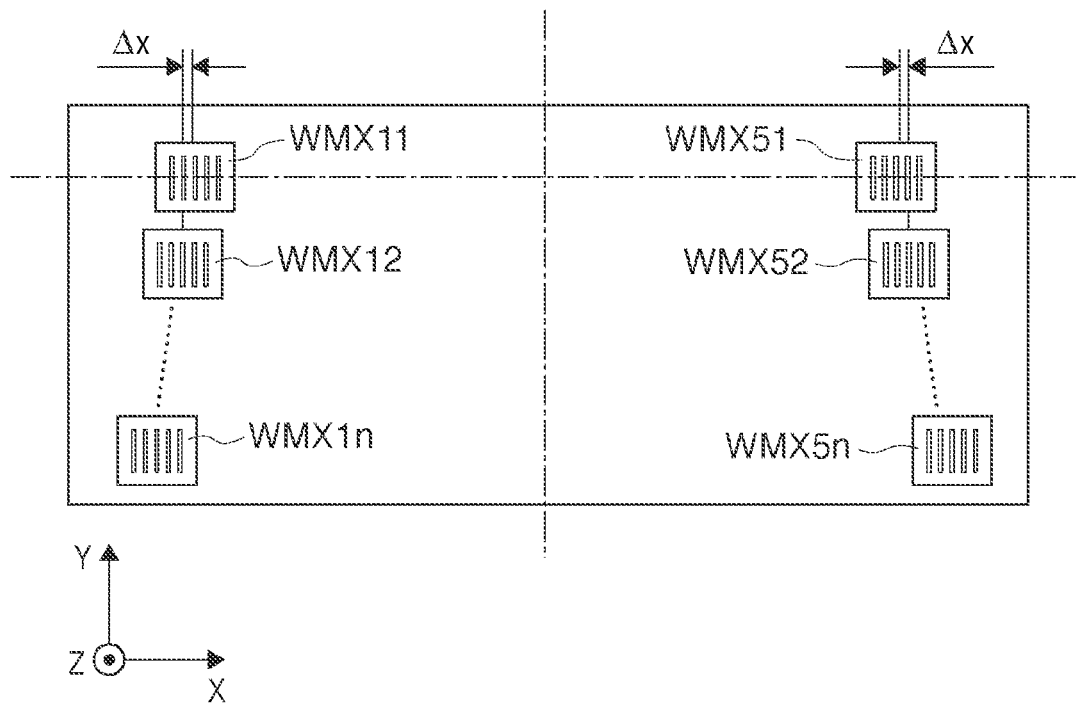
FIG. 6 is a view illustrating marks used in the second embodiment.

Marks WMX1 and WMX5 at the m-th positions from the top on the paper surface of FIG. 6 are expressed as WMX1m and WMX5m, respectively, and their relative distance in the X direction is expressed as dWm. The state in which the marks WMX1m and WMX5m are aligned with marks RM1 and RM5, respectively, is described by:

$$(dR+\Delta dR)\cdot\beta_0 \approx dWm \quad (5)$$

for m=1, 2, ..., n

In other words, the m-th marks which optimize the relative position between the marks WMX1 and WMX5 are used for the magnification $\beta_0$ of a projection optical system PO in a steady state. A controller CNT selects the marks (that is, determines the value m).

Also, the state in which Δβ is generated is described by:

$$(dR+\Delta dR)\cdot(\beta'+\Delta\beta) \approx dWm' \quad (6)$$

for m'=1, 2, ..., n

Hence, an optimum value of m' can be used.

In this manner, TTR measurement can be simultaneously performed at a plurality of image heights (two image heights in this case) by arranging a plurality of marks WMX with minutely different design coordinates, and selecting marks having an optimum span between them among the marks WMX by the controller CNT.

A method of determining an optimum value of m by the controller CNT will be described herein. If TTR measurement using the marks RMX1 and WMX11, and TTR measurement using the marks RMX5 and WMX51, can be simultaneously performed, they are performed simultaneously; otherwise, they are performed sequentially. At this time, trial-and-error measurement may be performed as needed, as in the first embodiment. Based on the amounts of shift of the relative positions from design values, the interval between the marks WMX1 and WMX5, which is optimum for simultaneous measurement, can be calculated. Hence, TTR measurement can be performed using marks WMX which are set at the m-th positions and have a desired interval between them. To be more precise, since even the marks WMX at the m-th positions may have manufacturing errors, more appropriate marks WMX may be selected by measuring several marks WMX, near the m-th marks, such as the (m−1)-th or (m+1)-th marks.

In the above-mentioned case, the values ΔdR and ΔdW are measured at once. On the other hand, the values ΔdR and ΔdW may be separately measured with reference to the amount of driving of a wafer stage WS, as in the first embodiment.

Although a method of obtaining the value m has been described above, the value m' can also be obtained in the same way. An optimum value of m' can always be obtained even if Δβ has changed, by measuring and storing manufacturing errors in advance by the above-mentioned method from the first positions to the n-th positions. Also, if the obtained measurement results show that Δβ has changed, m' is selected again in accordance with a change in Δβ in the next TTR measurement, thereby always performing TTR measurement in an optimum state.

Although methods of obtaining m and m' have been described above, the measurement order and combination of the marks RMX and WMX are not limited to those described earlier. FIG. 6 shows only the marks WMX for the sake of simplicity, but the marks WM may also include marks WMY. Although the marks WMX for measuring the positions in the X direction include two types of marks WMX1 and WMX5 in this embodiment, they may include a larger number of types of marks. Also, although the wafer-side measurement marks WMX have been described in this embodiment, not the wafer-side measurement marks WMX but the reticle-side measurement marks RMX may have the above-mentioned arrangement, or both of them may have arrangements as described above.

The values $dW_0$ (m=0), dx, and dy are desirably optimized by taking account of, for example, manufacturing errors of the marks RMX and WMX, and the amount of fluctuation in magnification β of the projection optical system PO.

Third Embodiment

The third embodiment of the present invention will be described. Details which are not particularly referred to in the third embodiment can be the same as in the first embodiment.

Figure 7:
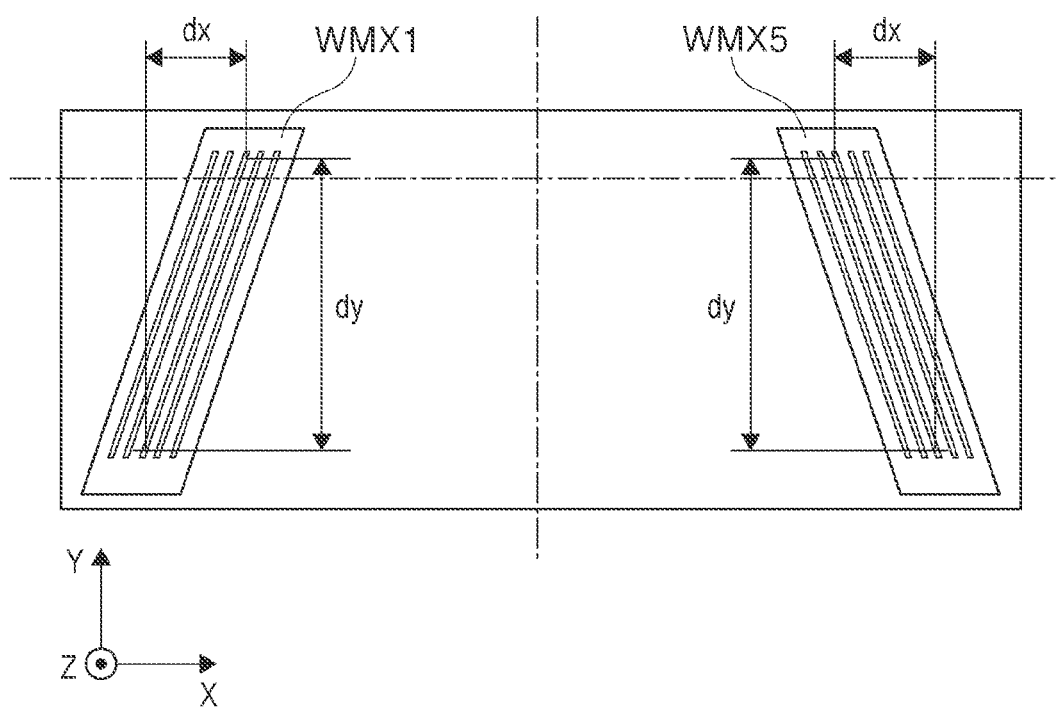
FIG. 7 is a view illustrating marks used in the third embodiment.

Details of the third embodiment will be described with reference to FIG. 7. In the third embodiment, marks WMX of marks WM are parallelogrammic, and extend in almost the Y direction. Marks WMX1 and WMX5 are symmetrical about the Y-axis. The relative distance between the marks WMX1 and WMX5 is given by:

$$dWy = (dx/dy) \cdot \Delta y \cdot 2 + dW_0 \quad (7)$$

where $dW_0$ is the relative distance between the marks WMX1 and WMX5 on the upper edges of the marks WMX on the paper surface of FIG. 7, and $\Delta y$ is the distance from the upper edge to the lower edge.

In other words, the relative distance dWy between the marks WMX1 and WMX5 can be arbitrarily determined by freely changing $\Delta y$. The controller CNT determines the relative distance dWy.

Hence, even if $\Delta dR$ or $\Delta \beta$ is generated, TTR measurement can be performed simultaneously at a plurality of image heights (two image heights in this case) by appropriately determining $\Delta y$ by the controller CNT, and performing measurement using the photosensor IS. $\Delta W$ can be included in $dW_0$. When the photosensor IS includes a two-dimensional image sensing element, the image sensing region can be determined in accordance with $\Delta y$.

Although a line-and-space pattern which forms the mark WM is linear in this embodiment, the present invention is not limited to this, and this pattern may be curved. Also, although the marks WM1 and WM5 are symmetrical about the Y-axis in this embodiment, the present invention is not limited to this, and these marks exhibit an effect even if they are not symmetrical about the Y-axis as long as the relative distance between the marks WM1 and WM5 as a function of $\Delta y$ is known in advance.

Methods of obtaining and selecting $\Delta y$ are the same as those for m and m' in the second embodiment. The second and third embodiments are different in that in the former m is intermittent, whereas in the latter $\Delta y$ is continuous.

Although the marks WMX for measuring the positions in the X direction include two types of marks WMX1 and WMX5 in this embodiment, they may include a larger number of types of marks. In this case, the relative distance between the individual marks as a function of $\Delta y$ must be known in advance. Also, although the wafer-side measurement marks WMX have been described in this embodiment, not the wafer-side measurement marks WMX but the reticle-side measurement marks RMX may have the above-mentioned arrangement, or both of them may have arrangements as described above.

Maximum values of $dW_0$ ($\Delta y=0$) and $\Delta y$, and an optimum value of $\Delta x$ are desirably optimized by taking account of, for example, manufacturing errors of the marks RM and WM, and the amount of fluctuation in magnification β of a projection optical system PO.

FIG. 7 shows only the marks WMX for the sake of simplicity, but the marks WM may also include marks WMY.

Fourth Embodiment

The fourth embodiment of the present invention will be described. Details which are not particularly referred to in the fourth embodiment can be the same as in the first embodiment.

Figure 8A:
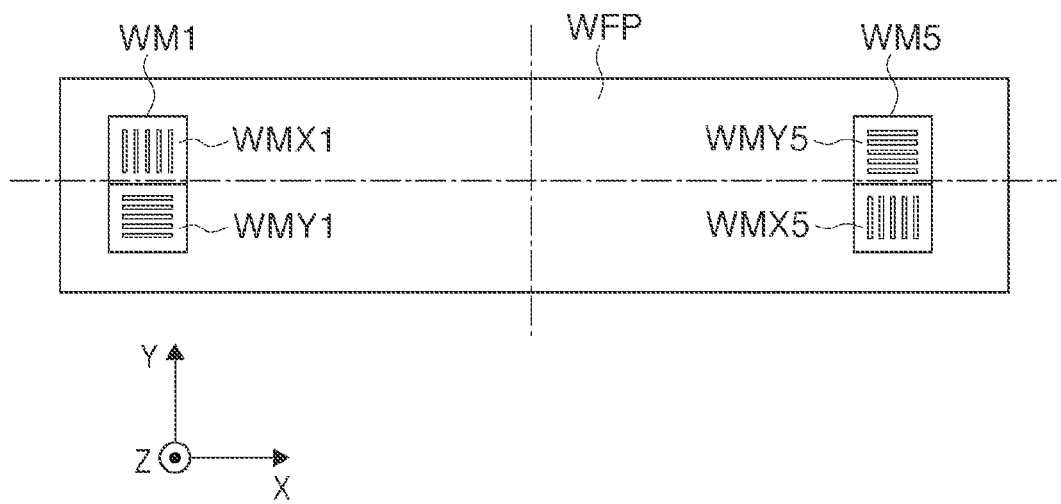
FIGS. 8A and 8B are views illustrating marks used in the fourth embodiment.

Details of the fourth embodiment will be described with reference to FIG. 8A. The fourth embodiment is different from the first embodiment in the arrangement of marks WMX for measuring the positions in the X direction, and marks WMY for measuring the positions in the Y direction. Although not illustrated, reticle-side measurement marks RM have the same arrangement as wafer-side position measurement marks WM.

Assume that TTR measurement using marks RM1 and WM1, and TTR measurement using marks RM5 and WM5, are simultaneously performed. In this case, the relative positions, in the X direction, between the reticle-side measurement marks and wafer-side position measurement marks for measuring the positions in the X direction must be aligned with high accuracy. In contrast, the relative positions, in the X direction, between the reticle-side measurement marks and wafer-side position measurement marks for measuring the positions in the Y direction need not be aligned with high accuracy. The requirement for relative alignment accuracy, that is opposite to the marks for measuring the positions in the X direction, holds true for the marks for measuring the positions in the Y direction. Hence, even under the influence of, for example, manufacturing errors of the marks RM and WM, or a fluctuation in magnification of a projection optical system PO, high relative position alignment accuracy is unnecessary in simultaneously measuring the marks for measuring the positions in the X direction, and those for measuring the positions in the Y direction.

Hence, TTR measurement in the X direction can be performed using a mark WMX1 and its corresponding mark RMX1, while TTR measurement in the Y direction is performed using a mark WMY5 and its corresponding mark RMY5. Also, TTR measurement in the Y direction can be performed using a mark WMY1 and its corresponding mark RMY1, while TTR measurement in the X direction is performed using a mark WMX5 and its corresponding RMX5. In this case, a signal exemplified in FIG. 4B is obtained while simultaneously changing the relative position between the reticle-side measurement marks and the wafer-side position measurement marks in both the X and Y directions.

Figure 8B:
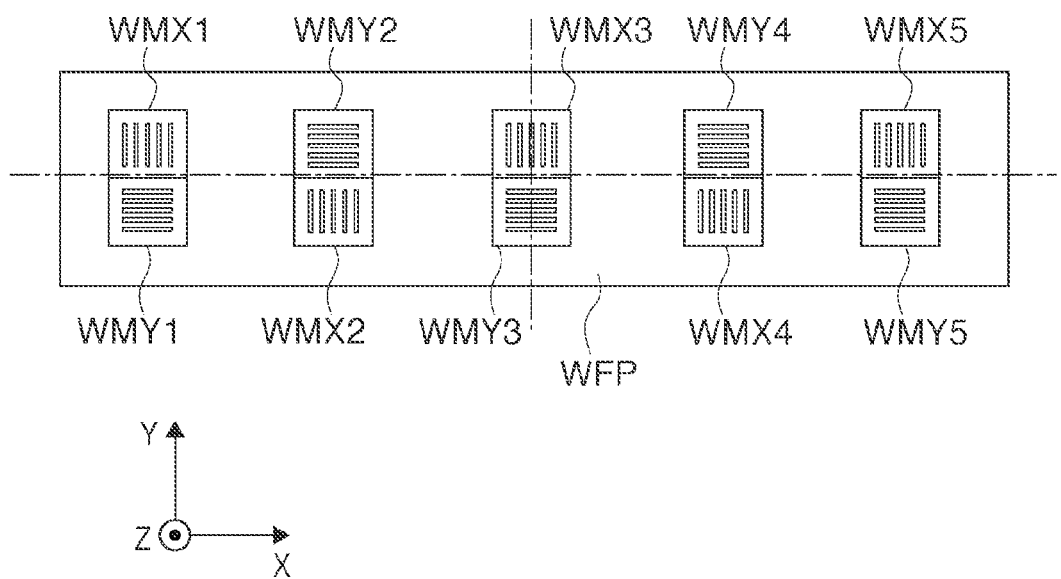

Although two sets of marks: a set of the marks RM1 and WM1 and a set of the marks RM5 and WM5 are used in the foregoing description, the present invention is valid even for a larger number of combinations of marks. For example, five sets of marks RM and WM, as illustrated in FIG. 8B, may be used. When five sets of marks are used, in the first embodiment, not only first-order aberration components (magnification components) but also third-order aberration components (distortion components) may have to be corrected to optimize an image of the projection optical system PO. In contrast, in the fourth embodiment, when measurement is simultaneously performed using the marks WMX1, WMY2, WMX3, WMY4, and WMX5, the relative position between the marks WMY2 and WMY4 in the X direction need not be aligned with high accuracy because these two marks are used to measure the positions in the Y direction. In view of this, since the marks WMX1, WMX3, and WMX5 need only be corrected in first-order magnification, the relative position between the marks RM and WM can be easily aligned. Hence, the fourth embodiment is useful even if pluralities of marks RM and WM are formed.

The above-mentioned four embodiments need not always be independent of each other, and exhibit an effect when used in combination as well. Especially the first embodiment can be combined with all of the second to fourth embodiments.

[Device Manufacturing Method]

A device manufacturing method according to an embodiment of the present invention is suitable for manufacturing devices such as a semiconductor device and a liquid crystal device. The method can include a step of exposing a substrate coated with a photosensitive agent using the above-mentioned exposure apparatus, and a step of developing the exposed substrate. The device manufacturing method can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-207533, filed Sep. 8, 2009, which is hereby incorporated by reference herein in its entirety.

What is claimed is:

1. An exposure apparatus which projects a pattern of an original onto a substrate by a projection optical system to expose the substrate, the apparatus comprising:
a measurement device configured to perform a measurement using an original-side fiducial plate arranged on one of the original and the original stage, and a substrate-side fiducial plate arranged on the substrate stage; and
a controller configured to control the projection optical system,
the original-side fiducial plate including a first original-side mark and a second original-side mark, and the substrate-side fiducial plate including a first substrate-side mark and a second substrate-side mark, the measurement including a first measurement performed using the first original-side mark and the first substrate-side mark while moving the substrate-side fiducial plate in a direction of the optical axis of the projection optical system, and a second measurement performed using the second original-side mark and the second substrate-side mark while moving the substrate-side fiducial plate in the direction of the optical axis of the projection optical system,
wherein the controller is configured to control imaging characteristics of the projection optical system associated with a direction perpendicular to the optical axis of the projection optical system so that the first measurement and the second measurement can be performed simultaneously, and to cause the measurement device to perform the first measurement and the second measurement simultaneously after controlling the imaging characteristic by the controller.

2. The apparatus according to claim 1, wherein the imaging characteristics controlled by the controller include at least one of a magnification and distortion of the projection optical system.

3. The apparatus according to claim 1, wherein the controller controls one of magnification and distortion of the projection optical system so that the first measurement and the second measurement can be performed simultaneously.

4. The apparatus according to claim 1, wherein the controller is configured to determine an amount of changing the image characteristic based on a manufacturing error associated with at least one of a distance between the first original-side mark and the second original-side mark and a distance between the first substrate-side mark and the second substrate-side mark, and to control the imaging characteristic of the projection optical system based on the determined amount.

5. An exposure apparatus which projects a pattern of an original onto a substrate by a projection optical system to expose the substrate, the apparatus comprising:
a measurement device configured to perform a measurement using an original-side fiducial plate arranged on one of the original and the original stage, and a substrate-side fiducial plate arranged on the substrate stage; and
a controller,
the original-side fiducial plate including a plurality of sets each including a first original-side marks and a second original-side mark, and the substrate-side fiducial plate including a first substrate-side mark and a second substrate-side mark, the measurement including a first measurement performed using the first original-side mark of a selected set and the first substrate-side mark while moving the substrate-side fiducial plate in a direction of the optical axis of the projection optical system, and a second measurement performed using the second original-side mark of the selected set and the second substrate-side mark while moving the substrate-side fiducial plate in the direction of the optical axis of the projection optical system,
wherein the first original-side marks and the second original-side marks of the plurality of sets have a line pattern extending in a certain direction, and distances between the first and second original-side marks of respective ones of the plurality of sets in a first direction are differentiated in accordance with positions of the plurality of sets in a second direction perpendicular to the first direction,
wherein the controller is configured to select one of the plurality of sets so that the first measurement and the second measurement can be performed simultaneously, and to cause the measurement device to perform the first measurement and the second measurement simultaneously using the selected set.

6. An exposure apparatus that projects a pattern of an original onto a substrate by a projection optical system to expose the substrate, the apparatus comprising:
a measurement device configured to perform a measurement using an original-side fiducial plate arranged on one of the original and the original stage, and a substrate-side fiducial plate arranged on the substrate stage; and
a controller,
the original-side fiducial plate including a first original-side mark and a second original-side mark, and the substrate-side fiducial plate including a plurality of sets each including a first substrate-side marks and a second substrate-side mark, the measurement including a first measurement performed using the first original-side mark and the first substrate-side mark of a selected set while moving the substrate-side fiducial plate in a direction of the optical axis of the projection optical system, and a second measurement performed using the second original-side mark and the second substrate-side mark of the selected set while moving the substrate-side fiducial plate in the direction of the optical axis of the projection optical system, wherein the first substrate-side marks and the second substrate-side marks of the plurality of sets have a line pattern extending in a certain direction, and distances between the first and second substrate-side marks of respective ones of the plurality of sets in a first direction are differentiated in accordance with positions of the plurality of sets in a second direction perpendicular to the first direction, wherein the controller is configured to select one of the plurality of sets so that the first measurement and the second measurement can be performed simultaneously, and to cause the measurement device to perform the first measurement and the second measurement simultaneously using the selected set.

7. An exposure apparatus which projects a pattern of an original onto a substrate by a projection optical system to expose the substrate, the apparatus comprising:

a measurement device configured to perform a measurement; and a controller, the original-side fiducial plate including a first original-side mark and a second original-side mark, the first original-side mark and the second original-side mark having an interval therebetween in a first direction, which changes in accordance with positions thereof in a second direction perpendicular to the first direction, and the substrate-side fiducial plate including a first substrate-side mark and a second substrate-side mark, the measurement including a first measurement performed using the first original-side mark and the first substrate-side mark, and a second measurement performed using the second original-side mark and the second substrate-side mark, wherein the controller is configured to determine a position in the second direction, where the first measurement and the second measurement can be performed simultaneously, and to cause the measurement device to perform the first measurement and the second measurement simultaneously at the determined position.

8. An exposure apparatus which projects a pattern of an original onto a substrate by a projection optical system to expose the substrate, the apparatus comprising:

a measurement device configured to perform a measurement; and a controller, the original-side fiducial plate including a first original-side mark and a second original-side mark, the substrate-side fiducial plate including a first substrate-side mark and a second substrate-side mark, and the first substrate-side mark and the second substrate-side mark having an interval therebetween in a first direction, which changes in accordance with positions thereof in a second direction perpendicular to the first direction, the measurement including a first measurement performed using the first original-side mark and the first substrate-side mark, and a second measurement performed using the second original-side mark and the second substrate-side mark, wherein the controller is configured to determine a position in the second direction, where the first measurement and the second measurement can be performed simultaneously, and to cause the measurement device to perform the first measurement and the second measurement simultaneously at the determined position.

9. A method of manufacturing a device, the method comprising:

exposing a substrate to light using an exposure apparatus which projects a pattern of an original onto the substrate by a projection optical system; and developing the exposed substrate, wherein the exposure apparatus comprises:

a measurement device configured to perform a measurement using an original-side fiducial plate arranged on one of the original and the original stage, and a substrate-side fiducial plate arranged on the substrate stage; and a controller configured to control the projection optical system, the original-side fiducial plate including a first original-side mark and a second original-side mark, and the substrate-side fiducial plate including a first substrate-side mark and a second substrate-side mark, the measurement including a first measurement performed using the first original-side mark and the first substrate-side mark while moving the substrate-side fiducial plate in a direction of the optical axis of the projection optical system, and a second measurement performed using the second original-side mark and the second substrate-side mark while moving the substrate-side fiducial plate in the direction of the optical axis of the projection optical system, wherein the controller is configured to control imaging characteristics of the projection optical system associated with a direction perpendicular to the optical axis of the projection optical system so that the first measurement and the second measurement can be performed simultaneously, and to cause the measurement device to perform the first measurement and the second measurement simultaneously after controlling the imaging characteristic by the controller.

10. A method of manufacturing a device, the method comprising:

exposing a substrate to light using an exposure apparatus which projects a pattern of an original onto the substrate by a projection optical system; and developing the exposed substrate, wherein the exposure apparatus comprises:

a measurement device configured to perform a measurement using an original-side fiducial plate arranged on one of the original and the original stage, and a substrate-side fiducial plate arranged on the substrate stage; and a controller, the original-side fiducial plate including a plurality of sets each including a first original-side mark and a second original-side mark, and the substrate-side fiducial plate including a first substrate-side mark and a second substrate-side mark, the measurement including a first measurement performed using the first original-side mark of a selected set and the first substrate-side mark while moving the substrate-side fiducial plate in a direction of the optical axis of the projection optical system, and a second measurement performed using the second original-side mark of the selected set and the second substrate-side mark while moving the substrate-side fiducial plate in the direction of the optical axis of the projection optical system, wherein the first original-side marks and the second original-side marks of the plurality of sets have a line pattern extending in a certain direction, and distances between the first and second original-side marks of respective ones of the plurality of sets in a first direction are differentiated in accordance with positions of the plurality of sets in a second direction perpendicular to the first direction, wherein the controller is configured to select one of the plurality of sets so that the first measurement and the second measurement can be performed simultaneously, and to cause the measurement device to perform the first measurement and the second measurement simultaneously using the selected set.

11. A method of manufacturing a device, the method comprising:

exposing a substrate to light using an exposure apparatus which projects a pattern of an original onto the substrate by a projection optical system; and developing the exposed substrate, wherein the exposure apparatus comprises:

a measurement device configured to perform a measurement using an original-side fiducial plate arranged on one of the original and the original stage, and a substrate-side fiducial plate arranged on the substrate stage; and a controller, the original-side fiducial plate including a first original-side mark and a second original-side mark, and the substrate-side fiducial plate including a plurality of sets each including a first substrate-side marks and a second substrate-side marks, the measurement including a first measurement performed using the first original-side mark and the first substrate-side mark of a selected set while moving the substrate-side fiducial plate in a direction of the optical axis of the projection optical system, and a second measurement performed using the second original-side mark and the second substrate-side mark of the selected set while moving the substrate-side fiducial plate in the direction of the optical axis of the projection optical system, wherein the first substrate-side marks and the second substrate-side marks of the plurality of sets have a line pattern extending in a certain direction, and distances between the first and second substrate-side marks of respective ones of the plurality of sets in a first direction are differentiated in accordance with positions of the plurality of sets in a second direction perpendicular to the first direction, wherein the controller is configured to select one of the plurality of sets so that the first measurement and the second measurement can be performed simultaneously, and to cause the measurement device to perform the first measurement and the second measurement simultaneously using the selected set.

12. A method of manufacturing a device, the method comprising:

exposing a substrate to light using an exposure apparatus which projects a pattern of an original onto the substrate by a projection optical system; and developing the exposed substrate, wherein the exposure apparatus comprises:

a measurement device configured to perform a measurement; and a controller, the original-side fiducial plate including a first original-side mark and a second original-side mark, the first original-side mark and the second original-side mark having an interval therebetween in a first direction, which changes in accordance with positions thereof in a second direction perpendicular to the first direction, and the substrate-side fiducial plate including a first substrate-side mark and a second substrate-side mark, the measurement including a first measurement performed using the first original-side mark and the first substrate-side mark, and a second measurement performed using the second original-side mark and the second substrate-side mark, wherein the controller is configured to determine a position in the second direction, where the first measurement and the second measurement can be performed simultaneously, and to cause the measurement device to perform the first measurement and the second measurement simultaneously at the determined position.

13. A method of manufacturing a device, the method comprising:

exposing a substrate to light using an exposure apparatus which projects a pattern of an original onto the substrate by a projection optical system; and developing the exposed substrate, wherein the exposure apparatus comprises:

a measurement device configured to perform a measurement; and a controller, the original-side fiducial plate including a first original-side mark and a second original-side mark, the substrate-side fiducial plate including a first substrate-side mark and a second substrate-side mark, and the first substrate-side mark and the second substrate-side mark having an interval therebetween in a first direction, which changes in accordance with positions thereof in a second direction perpendicular to the first direction, the measurement including a first measurement performed using the first original-side mark and the first substrate-side mark, and a second measurement performed using the second original-side mark and the second substrate-side mark, wherein the controller is configured to determine a position in the second direction, where the first measurement and the second measurement can be performed simultaneously, and to cause the measurement device to perform the first measurement and the second measurement simultaneously at the determined position.

* * * * *